(12) United States Patent
Fujimura et al.

(10) Patent No.: US 9,091,946 B2
(45) Date of Patent: Jul. 28, 2015

(54) METHOD AND SYSTEM FOR FORMING NON-MANHATTAN PATTERNS USING VARIABLE SHAPED BEAM LITHOGRAPHY

(71) Applicant: D2S, Inc., San Jose, CA (US)

(72) Inventors: Akira Fujimura, Saratoga, CA (US); Ingo Bork, Mountain View, CA (US); Etienne Jacques, Sunnyvale, CA (US)

(73) Assignee: D2S, Inc., San Jose, CA (US)

( * ) Notice: Subject to any disclaimer, the term of this patent is extended or adjusted under 35 U.S.C. 154(b) by 0 days.

(21) Appl. No.: 13/948,725

(22) Filed: Jul. 23, 2013

(65) Prior Publication Data

US 2013/0306884 A1    Nov. 21, 2013

Related U.S. Application Data

(62) Division of application No. 13/429,357, filed on Mar. 24, 2012, now abandoned.

(60) Provisional application No. 61/479,372, filed on Apr. 26, 2011.

(51) Int. Cl.
*G06F 17/50*    (2006.01)
*G03F 1/78*    (2012.01)
(Continued)

(52) U.S. Cl.
CPC .. *G03F 1/78* (2013.01); *G03F 1/20* (2013.01); *H01J 37/3175* (2013.01); *G03F 1/144* (2013.01); *G03F 1/36* (2013.01); *G03F 7/705* (2013.01); *G06F 17/5068* (2013.01)

(58) Field of Classification Search
CPC ........... G03F 1/144; G03F 1/36; G03F 7/705; G06F 17/5068
USPC ................................................. 716/52, 53, 55
See application file for complete search history.

(56) References Cited

U.S. PATENT DOCUMENTS 4,634,871 A    1/1987 Knauer
4,698,509 A    10/1987 Wells et al.
(Continued)

FOREIGN PATENT DOCUMENTS

CN    1193810 A    9/1998
EP    1429368 A2    6/2004
(Continued)

OTHER PUBLICATIONS

Chinese Office Action dated Sep. 11, 2013 for Chinese Application No. 200980134188.6.
(Continued)

*Primary Examiner* — Jack Chiang
*Assistant Examiner* — Magid Dimyan
(74) *Attorney, Agent, or Firm* — The Mueller Law Office, P.C.

(57) ABSTRACT

A method and system for fracturing or mask data preparation or proximity effect correction is disclosed in which a series of charged particle beam shots is determined, where the series of shots is capable of forming a continuous non-manhattan track on a surface, such that the non-manhattan track has a line width roughness (LWR) which nearly equals a target LWR. A method and system for fracturing or mask data preparation or proximity effect correction is also disclosed in which at least two series of shots are determined, where each series of shots is capable of forming a continuous non-manhattan track on a surface, and where the space between tracks has space width roughness (SWR) which nearly equals a target SWR.

11 Claims, 6 Drawing Sheets

(51) Int. Cl.
*G03F 1/20* (2012.01)
*H01J 37/317* (2006.01)
*G03F 7/20* (2006.01)
*G03F 1/00* (2012.01)
*G03F 1/36* (2012.01)

(56) References Cited

U.S. PATENT DOCUMENTS

| | | |
|---|---|---|
| 4,818,885 A | 4/1989 | Davis et al. |
| 5,173,582 A | 12/1992 | Sakamoto et al. |
| 5,334,282 A | 8/1994 | Nakayama et al. |
| 5,723,237 A | 3/1998 | Kobayashi et al. |
| 5,825,039 A | 10/1998 | Hartley |
| 5,856,677 A | 1/1999 | Okino |
| 5,885,748 A | 3/1999 | Ohnuma |
| 6,218,671 B1 | 4/2001 | Gordon et al. |
| 6,262,427 B1 | 7/2001 | Gordon |
| 6,291,119 B2 | 9/2001 | Choi et al. |
| 6,372,391 B1 | 4/2002 | Wolfe et al. |
| 6,433,348 B1 | 8/2002 | Abboud et al. |
| 6,557,162 B1 | 4/2003 | Pierrat |
| 6,610,989 B1 | 8/2003 | Takahashi |
| 6,627,366 B2 | 9/2003 | Yang |
| 6,891,175 B2 | 5/2005 | Hiura |
| 7,150,949 B2 | 12/2006 | Askebjer et al. |
| 7,269,819 B2 | 9/2007 | Hoshino |
| 7,449,700 B2 | 11/2008 | Inanami |
| 7,536,664 B2 | 5/2009 | Cohn et al. |
| 7,592,611 B2 | 9/2009 | Kasahara et al. |
| 7,754,401 B2 | 7/2010 | Fujimura et al. |
| 7,759,027 B2 | 7/2010 | Fujimura et al. |
| 7,842,936 B2 | 11/2010 | Kruit et al. |
| 8,017,286 B2 | 9/2011 | Fujimura et al. |
| 8,039,176 B2 | 10/2011 | Fujimura et al. |
| 8,137,871 B2 | 3/2012 | Zable et al. |
| 8,473,875 B2 | 6/2013 | Fujimura et al. |
| 8,501,374 B2 | 8/2013 | Fujimura et al. |
| 2002/0005494 A1 | 1/2002 | Kamijo et al. |
| 2002/0020824 A1 | 2/2002 | Itoh |
| 2002/0125444 A1 | 9/2002 | Kojima |
| 2002/0129328 A1 | 9/2002 | Komatsuda |
| 2003/0043358 A1 | 3/2003 | Suganuma et al. |
| 2003/0082461 A1 | 5/2003 | Carpi |
| 2003/0087191 A1 | 5/2003 | Lavallee et al. |
| 2003/0159125 A1 | 8/2003 | Wang et al. |
| 2003/0203287 A1 | 10/2003 | Miyagawa |
| 2004/0011966 A1 | 1/2004 | Sasaki et al. |
| 2004/0099636 A1 | 5/2004 | Scipioni |
| 2005/0053850 A1 | 3/2005 | Askebjer et al. |
| 2005/0221204 A1 | 10/2005 | Kimura |
| 2006/0085773 A1 | 4/2006 | Zhang |
| 2006/0218520 A1 | 9/2006 | Pierrat et al. |
| 2007/0114463 A1 | 5/2007 | Nakasugi et al. |
| 2007/0196768 A1 | 8/2007 | Ogino |
| 2007/0280526 A1 | 12/2007 | Malik et al. |
| 2008/0054196 A1 | 3/2008 | Hiroshima |
| 2008/0116398 A1 | 5/2008 | Hara et al. |
| 2009/0200495 A1 | 8/2009 | Platzgummer |
| 2009/0307649 A1 | 12/2009 | Pramanik et al. |
| 2009/0325085 A1 | 12/2009 | Yoshida et al. |
| 2010/0030545 A1 | 2/2010 | Uno et al. |
| 2010/0055586 A1 | 3/2010 | Fujimura et al. |
| 2010/0058279 A1 | 3/2010 | Fujimura et al. |
| 2010/0058282 A1 | 3/2010 | Fujimura et al. |
| 2010/0148087 A1 | 6/2010 | Doering et al. |
| 2010/0183963 A1 | 7/2010 | Zable et al. |
| 2010/0264335 A1 | 10/2010 | Hoyle et al. |
| 2010/0315611 A1 | 12/2010 | Kato |
| 2010/0325595 A1 | 12/2010 | Song et al. |
| 2011/0033788 A1 | 2/2011 | Kato |
| 2011/0037988 A1 | 2/2011 | Brill |
| 2011/0053056 A1 | 3/2011 | Fujimura et al. |
| 2011/0089344 A1 | 4/2011 | Fujimura et al. |
| 2011/0116067 A1 | 5/2011 | Ye et al. |
| 2011/0145769 A1 | 6/2011 | Wei |
| 2011/0159435 A1 | 6/2011 | Zable et al. |
| 2011/0177458 A1 | 7/2011 | Kotani et al. |
| 2012/0094219 A1 | 4/2012 | Fujimura et al. |
| 2012/0096412 A1 | 4/2012 | Fujimura et al. |
| 2012/0149133 A1 | 6/2012 | Parrish et al. |
| 2012/0151428 A1 | 6/2012 | Tanaka et al. |
| 2012/0217421 A1 | 8/2012 | Fujimura et al. |
| 2013/0070222 A1 | 3/2013 | Fujimura |
| 2013/0283218 A1 | 10/2013 | Fujimura et al. |

FOREIGN PATENT DOCUMENTS

| | | |
|---|---|---|
| GB | 2367908 | 4/2002 |
| JP | S5425675 A | 2/1979 |
| JP | S54025675 | 2/1979 |
| JP | S608844 A | 1/1985 |
| JP | 61105839 | 5/1986 |
| JP | 63007631 | 1/1988 |
| JP | H02280315 A | 11/1990 |
| JP | 03205815 | 9/1991 |
| JP | H03205815 A | 9/1991 |
| JP | 04196516 | 7/1992 |
| JP | 4196516 | 7/1992 |
| JP | H04196516 A | 7/1992 |
| JP | 05036595 | 2/1993 |
| JP | H0536595 A | 2/1993 |
| JP | H05036595 | 2/1993 |
| JP | 05267133 | 10/1993 |
| JP | H05267133 A | 10/1993 |
| JP | H05335221 A | 12/1993 |
| JP | H0620931 A | 1/1994 |
| JP | H06020931 | 1/1994 |
| JP | 06124883 | 5/1994 |
| JP | 08055771 | 2/1996 |
| JP | H0855771 A | 2/1996 |
| JP | 08064522 | 3/1996 |
| JP | H08195339 A | 7/1996 |
| JP | 8222504 | 8/1996 |
| JP | H08222504 A | 8/1996 |
| JP | H09266153 A | 10/1997 |
| JP | 10294255 | 11/1998 |
| JP | H11111594 A | 4/1999 |
| JP | 11233401 | 8/1999 |
| JP | 2000091191 A | 3/2000 |
| JP | 2000123768 A | 4/2000 |
| JP | 2000138165 A | 5/2000 |
| JP | 2000269123 A | 9/2000 |
| JP | 2001013671 A | 1/2001 |
| JP | 2001093809 A | 4/2001 |
| JP | 2001203157 A | 7/2001 |
| JP | 2001230203 A | 8/2001 |
| JP | 2001305720 A | 11/2001 |
| JP | 2001313253 A | 11/2001 |
| JP | 2002075830 A | 3/2002 |
| JP | 2002110508 A | 4/2002 |
| JP | 2002202590 A | 7/2002 |
| JP | 2002217092 A | 8/2002 |
| JP | 2003195511 A | 7/2003 |
| JP | 2003315976 A | 11/2003 |
| JP | 2003338460 A | 11/2003 |
| JP | 2003347192 A | 12/2003 |
| JP | 2004088071 A | 3/2004 |
| JP | 2004134447 A | 4/2004 |
| JP | 2004170410 A | 6/2004 |
| JP | 2004273526 A | 9/2004 |
| JP | 2004304031 A | 10/2004 |
| JP | 2004356440 A | 12/2004 |
| JP | 2005079111 A | 3/2005 |
| JP | 2006032814 A | 2/2006 |
| JP | 2006059348 A | 3/2006 |
| JP | 2006100336 A | 4/2006 |
| JP | 2006108447 A | 4/2006 |
| JP | 2006222230 A | 8/2006 |
| JP | 2006294794 A | 10/2006 |
| JP | 2007041090 A | 2/2007 |
| JP | 2007103923 A | 4/2007 |
| JP | 2007242710 A | 9/2007 |
| JP | 2007305880 A | 11/2007 |
| JP | 2008066441 A | 3/2008 |

(56) References Cited

FOREIGN PATENT DOCUMENTS

| | | |
|---|---|---|
| JP | 2008096486 A | 4/2008 |
| JP | 2009147254 A | 7/2009 |
| JP | 2011040716 A | 2/2011 |
| TW | 495834 B | 7/2002 |
| TW | I222100 B | 10/2004 |
| TW | I233149 B | 5/2005 |
| TW | 200604763 A | 2/2006 |
| TW | 200700932 | 1/2007 |
| WO | 03036386 A | 5/2003 |
| WO | 2008064155 A | 5/2008 |

OTHER PUBLICATIONS

Japanese Office Action dated Aug. 20, 2013 for Japanese Patent Application No. 2011-525073.
Japanese Office Action dated Oct. 1, 2013 for Japanese Patent Application No. 2011-525090.
Japanese Office Action dated Oct. 8, 2013 for Japanese Patent Application No. 2011-525091.
Notice of Allowance and Fee(s) dated Oct. 11, 2013 for U.S. Appl. No. 13/923,368.
Notice of Allowance and Fees dated Aug. 23, 2013 for U.S. Appl. No. 13/723,181.
Office Action dated Oct. 25, 2013 for U.S. Appl. No. 13/037,263.
Office Action dated Oct. 29, 2013 for U.S. Appl. No. 13/037,270.
Office Action dated Sep. 10, 2013 for U.S. Appl. No. 13/329,314.
Office Action dated Sep. 24, 2013 for U.S. Appl. No. 13/329,315.
Pierrat and Bork, "Impact of Model-Based Fracturing on E-beam Proximity Effect Correction Methodology", Sep. 29, 2010, Proc. of SPIE, vol. 7823, pp. 782313-1-782313-11, Photomask Technology 2010.
Notice of Allowance and Fees dated Dec. 26, 2013 for U.S. Appl. No. 13/862,472.
Office Action dated Feb. 14, 2014 for U.S. Appl. No. 13/631,941.
Office Action dated Feb. 27, 2014 for U.S. Appl. No. 13/236,610.
Office Action dated Mar. 11, 2014 for U.S. Appl. No. 13/959,530.
Office Action dated Mar. 13, 2014 for U.S. Appl. No. 13/862,476.
International Search Report and Written Opinion dated Oct. 29, 2012 for PCT Patent Application No. PCT/US2012/030487.
Notice of Allowance and Fees dated Aug. 1, 2014 for U.S. Appl. No. 14/108,135.
Notice of Allowance and Fees dated Aug. 15, 2014 for U.S. Appl. No. 13/959,530.
Notice of Allowance and Fees dated Jul. 23, 2014 for U.S. Appl. No. 13/970,465.
Office Action dated Aug. 5, 2014 for Japanese Patent Application No. 2012-525091.
Office Action dated Jul. 15, 2014 for U.S. Appl. No. 13/037,270.
Office Action dated Jul. 8, 2014 for Japanese Patent Application No. 2009-200191.
Office Action dated Oct. 6, 2014 for U.S. Appl. No. 14/331,008.
Official Letter and Search Report dated Aug. 21, 2014 for Taiwanese Patent Application No. 098128359.
Official letter and search report dated Aug. 6, 2014 for Taiwanese Patent Application No. 099127553.
Notice of Allowance and Fees dated Oct. 10, 2014 for U.S. Appl. No. 13/801,554.
Office Action dated Oct. 15, 2014 for U.S. Appl. No. 13/862,476.
Office Action dated Oct. 20, 2014 for U.S. Appl. No. 13/862,471.
Office Action dated Oct. 24, 2014 for U.S. Appl. No. 14/106,584.
Official Letter and Search Report dated Sep. 25, 2014 for Taiwanese Patent Application No. 099134186.
Official Letter and Search report dated Sep. 25, 2014 for Taiwanese Patent Application No. 98128360.
Office Action dated Apr. 15, 2014 for Japanese Patent Application No. 2011-525072.
Office Action dated Jun. 3, 2014 for Japanese Patent Application No. 2012-526931.
Office Action dated Jun. 10, 2014 for Japanese Patent Application No. 2011-525090.
Office Action dated Jun. 10, 2014 for JP Patent Application No. 2011-525073.
Office Action dated Jun. 3, 2014 for Japanese Patent Application No. 2012-535220.
Office Action dated Jun. 6, 2014 for U.S. Appl. No. 13/329,315.
Office Action dated May 13, 2014 for Japanese Patent Application No. 2010-183857.
Office Action dated May 27, 2014 for Japanese Patent Application No. 2012-535223.
Notice of Allowance and Fees dated Mar. 20, 2014 for U.S. Appl. No. 13/970,465.
Office Action dated Apr. 3, 2014 for Chinese patent application No. 200980134188.6.
Office Action dated May 9, 2014 for U.S. Appl. No. 14/106,584.
Office Action dated May 1, 2014 for U.S. Appl. No. 13/862,471.
Office Action dated May 5, 2014 for U.S. Appl. No. 13/862,475.
Search Report dated Apr. 9, 2014 for Taiwanese Application No. 98128358.
Notice of Allowance and Fees dated Feb. 9, 2015 for U.S. Appl. No. 13/037,270.
Notice of Allowance and Fees dated Jan. 21, 2015 for U.S. Appl. No. 14/257,874.
Notice of Allowance and Fees dated Jan. 23, 2015 for U.S. Appl. No. 13/862,476.
Notice of Allowance and Fees dated Jan. 26, 2015 for U.S. Appl. No. 14/106,584.
Office Action dated Feb. 6, 2015 for U.S. Appl. No. 13/862,475.
Office Action dated Jan. 6, 2015 for Japanese Patent Application No. 2010-183857.
Office Action dated Nov. 11, 2014 for Japanese Patent Application No. 2012-526931.
Official Letter and Search Report dated Oct. 24, 2014 for Taiwanese Patent Application No. 099134187.

METHOD AND SYSTEM FOR FORMING NON-MANHATTAN PATTERNS USING VARIABLE SHAPED BEAM LITHOGRAPHY

RELATED APPLICATIONS

This application is a divisional of U.S. patent application Ser. No. 13/429,357, entitled "Method and System for Forming Non-Manhattan Patterns Using Variable Shaped Beam Lithography", filed Mar. 24, 2012 and published as U.S. Patent Publication No. 2012/0278770; which claims priority from U.S. Provisional Patent Application Ser. No. 61/479,372, filed Apr. 26, 2011, entitled "Method And System For Forming A Pattern Using Overlapping Shots With Variable Shaped Beam Lithography," all of which are hereby incorporated by reference for all purposes.

BACKGROUND OF THE DISCLOSURE

The present disclosure is related to lithography, and more particularly to the design and manufacture of a surface which may be a reticle, a wafer, or any other surface, using charged particle beam lithography.

In the production or manufacturing of semiconductor devices, such as integrated circuits, optical lithography may be used to fabricate the semiconductor devices. Optical lithography is a printing process in which a lithographic mask or photomask manufactured from a reticle is used to transfer patterns to a substrate such as a semiconductor or silicon wafer to create the integrated circuit (I.C.). Other substrates could include flat panel displays, holographic masks or even other reticles. While conventional optical lithography uses a light source having a wavelength of 193 nm, extreme ultraviolet (EUV) or X-ray lithography are also considered types of optical lithography in this application. The reticle or multiple reticles may contain a circuit pattern corresponding to an individual layer of the integrated circuit, and this pattern can be imaged onto a certain area on the substrate that has been coated with a layer of radiation-sensitive material known as photoresist or resist. Once the patterned layer is transferred the layer may undergo various other processes such as etching, ion-implantation (doping), metallization, oxidation, and polishing. These processes are employed to finish an individual layer in the substrate. If several layers are required, then the whole process or variations thereof will be repeated for each new layer. Eventually, a combination of multiples of devices or integrated circuits will be present on the substrate. These integrated circuits may then be separated from one another by dicing or sawing and then may be mounted into individual packages. In the more general case, the patterns on the substrate may be used to define artifacts such as display pixels, holograms, or magnetic recording heads. Conventional optical lithography writing machines typically reduce the photomask pattern by a factor of four during the optical lithographic process. Therefore, patterns formed on the reticle or mask must be four times larger than the size of the desired pattern on the substrate or wafer.

In the production or manufacturing of semiconductor devices, such as integrated circuits, non-optical methods may be used to transfer a pattern on a lithographic mask to a substrate such as a silicon wafer. Nanoimprint lithography (NIL) is an example of a non-optical lithography process. In nanoimprint lithography, a lithographic mask pattern is transferred to a surface through contact of the lithography mask with the surface.

Two common types of charged particle beam lithography are variable shaped beam (VSB) and character projection (CP). These are both sub-categories of shaped beam charged particle beam lithography, in which a precise electron beam is shaped and steered so as to expose a resist-coated surface, such as the surface of a wafer or the surface of a reticle. In VSB, these shapes are simple shapes, usually limited to rectangles of certain minimum and maximum sizes and with sides which are parallel to the axes of a Cartesian coordinate plane (i.e. of "manhattan" orientation), and 45 degree right triangles (i.e. triangles with their three internal angles being 45 degrees, 45 degrees, and 90 degrees) of certain minimum and maximum sizes. At predetermined locations, doses of electrons are shot into the resist with these simple shapes. The total writing time for this type of system increases with the number of shots. In character projection (CP), there is a stencil in the system that has in it a variety of apertures or characters which may be complex shapes such as rectilinear, arbitrary-angled linear, circular, nearly circular, annular, nearly annular, oval, nearly oval, partially circular, partially nearly circular, partially annular, partially nearly annular, partially nearly oval, or arbitrary curvilinear shapes, and which may be a connected set of complex shapes or a group of disjointed sets of a connected set of complex shapes. An electron beam can be shot through a character on the stencil to efficiently produce more complex patterns on the reticle. In theory, such a system can be faster than a VSB system because it can shoot more complex shapes with each time-consuming shot. Thus, an E-shaped pattern shot with a VSB system takes four shots, but the same E-shaped pattern can be shot with one shot with a character projection system. Note that VSB systems can be thought of as a special (simple) case of character projection, where the characters are just simple characters, usually rectangles or 45-45-90 degree triangles. It is also possible to partially expose a character. This can be done by, for instance, blocking part of the particle beam. For example, the E-shaped pattern described above can be partially exposed as an F-shaped pattern or an I-shaped pattern, where different parts of the beam are cut off by an aperture. This is the same mechanism as how various sized rectangles can be shot using VSB. In this disclosure, partial projection is used to mean both character projection and VSB projection.

As indicated, in lithography the lithographic mask or reticle comprises geometric patterns corresponding to the circuit components to be integrated onto a substrate. The patterns used to manufacture the reticle may be generated utilizing computer-aided design (CAD) software or programs. In designing the patterns the CAD program may follow a set of pre-determined design rules in order to create the reticle. These rules are set by processing, design, and end-use limitations. An example of an end-use limitation is defining the geometry of a transistor in a way in which it cannot sufficiently operate at the required supply voltage. In particular, design rules can define the space tolerance between circuit devices or interconnect lines. The design rules are, for example, used to ensure that the circuit devices or lines do not interact with one another in an undesirable manner. For example, the design rules are used so that lines do not get too close to each other in a way that may cause a short circuit. The design rule limitations reflect, among other things, the smallest dimensions that can be reliably fabricated. When referring to these small dimensions, one usually introduces the concept of a critical dimension. These are, for instance, defined as the smallest width of a line or the smallest space between two lines, those dimensions requiring exquisite control.

One goal in integrated circuit fabrication by optical lithography is to reproduce the original circuit design on the substrate by use of the reticle. Integrated circuit fabricators are always attempting to use the semiconductor wafer real estate as efficiently as possible. Engineers keep shrinking the size of the circuits to allow the integrated circuits to contain more circuit elements and to use less power. As the size of an integrated circuit critical dimension is reduced and its circuit density increases, the critical dimension of the circuit pattern or physical design approaches the resolution limit of the optical exposure tool used in conventional optical lithography. As the critical dimensions of the circuit pattern become smaller and approach the resolution value of the exposure tool, the accurate transcription of the physical design to the actual circuit pattern developed on the resist layer becomes difficult. To further the use of optical lithography to transfer patterns having features that are smaller than the light wavelength used in the optical lithography process, a process known as optical proximity correction (OPC) has been developed. OPC alters the physical design to compensate for distortions caused by effects such as optical diffraction and the optical interaction of features with proximate features. OPC includes all resolution enhancement technologies performed with a reticle.

OPC may add sub-resolution lithographic features to mask patterns to reduce differences between the original physical design pattern, that is, the design, and the final transferred circuit pattern on the substrate. The sub-resolution lithographic features interact with the original patterns in the physical design and with each other and compensate for proximity effects to improve the final transferred circuit pattern. One feature that is used to improve the transfer of the pattern is a sub-resolution assist feature (SRAF). Another feature that is added to improve pattern transference is referred to as "serifs". Serifs are small features that can be positioned on an interior or exterior corner of a pattern to sharpen the corner in the final transferred image. It is often the case that the precision demanded of the surface manufacturing process for SRAFs is less than the precision demanded for patterns that are intended to print on the substrate, often referred to as main features. Serifs are a part of a main feature. As the limits of optical lithography are being extended far into the sub-wavelength regime, the OPC features must be made more and more complex in order to compensate for even more subtle interactions and effects. As imaging systems are pushed closer to their limits, the ability to produce reticles with sufficiently fine OPC features becomes critical. Although adding serifs or other OPC features to a mask pattern is advantageous, it also substantially increases the total feature count in the mask pattern. For example, adding a serif to each of the corners of a square using conventional techniques adds eight more rectangles to a mask or reticle pattern. Adding OPC features is a very laborious task, requires costly computation time, and results in more expensive reticles. Not only are OPC patterns complex, but since optical proximity effects are long range compared to minimum line and space dimensions, the correct OPC patterns in a given location depend significantly on what other geometry is in the neighborhood. Thus, for instance, a line end will have different size serifs depending on what is near it on the reticle. This is even though the objective might be to produce exactly the same shape on the wafer. These slight but critical variations are important and have prevented others from being able to form reticle patterns. It is conventional to discuss the OPC-decorated patterns to be written on a reticle in terms of designed features, that is features that reflect the design before OPC decoration, and OPC features, where OPC features might include serifs, jogs, and SRAF. To quantify what is meant by slight variations, a typical slight variation in OPC decoration from neighborhood to neighborhood might be 5% to 80% of a designed feature size. Note that for clarity, variations in the design of the OPC are what is being referenced. Manufacturing variations, such as line-edge roughness and corner rounding, will also be present in the actual surface patterns. When these OPC variations produce substantially the same patterns on the wafer, what is meant is that the geometry on the wafer is targeted to be the same within a specified error, which depends on the details of the function that that geometry is designed to perform, e.g., a transistor or a wire. Nevertheless, typical specifications are in the 2%-50% of a designed feature range. There are numerous manufacturing factors that also cause variations, but the OPC component of that overall error is often in the range listed. OPC shapes such as sub-resolution assist features are subject to various design rules, such as a rule based on the size of the smallest feature that can be transferred to the wafer using optical lithography. Other design rules may come from the mask manufacturing process or, if a character projection charged particle beam writing system is used to form the pattern on a reticle, from the stencil manufacturing process. It should also be noted that the accuracy requirement of the SRAF features on the mask may be lower than the accuracy requirements for the designed features on the mask. As process nodes continue to shrink, the size of the smallest SRAFs on a photomask also shrinks. For example, at the 20 nm logic process node, 40 nm to 60 nm SRAFs are needed on the mask for the highest precision layers.

In EUV lithography, OPC features are generally not required. Therefore, the complexity of the pattern to be manufactured on the reticle is less than with conventional 193 nm wavelength optical lithography, and shot count reduction is correspondingly less important. In EUV, however, mask accuracy requirements are very high because the patterns on the mask, which are typically 4× the size of the patterns on the wafer, are sufficiently small that they are challenging to form precisely using charged particle beam technology such as electron beam.

There are a number of technologies used for forming patterns on a reticle, including using optical lithography or charged particle beam lithography. The most commonly used system is the variable shaped beam (VSB), where, as described above, doses of electrons with simple shapes such as manhattan rectangles and 45-degree right triangles expose a resist-coated reticle surface. In conventional mask writing, the doses or shots of electrons are conventionally designed to avoid overlap wherever possible, so as to greatly simplify calculation of how the resist on the reticle will register the pattern. Similarly, the set of shots is designed so as to completely cover the pattern area that is to be formed on the reticle. U.S. Pat. No. 7,754,401, owned by the assignee of the present patent application and incorporated by reference for all purposes, discloses a method of mask writing in which intentional shot overlap for writing patterns is used. When overlapping shots are used, charged particle beam simulation can be used to determine the pattern that the resist on the reticle will register. Use of overlapping shots may allow patterns to be written with reduced shot count. U.S. Pat. No. 7,754,401 also discloses use of dose modulation, where the assigned dosages of shots vary with respect to the dosages of other shots. The term model-based fracturing is used to describe the process of determining shots using the techniques of U.S. Pat. No. 7,754,401.

Reticle writing for the most advanced technology nodes typically involves multiple passes of charged particle beam writing, a process called multi-pass exposure, whereby the given shape on the reticle is written and overwritten. Typically, two to four passes are used to write a reticle to average out precision errors in the charged particle beam writer, allowing the creation of more accurate photomasks. Also typically, the list of shots, including the dosages, is the same for every pass. In one variation of multi-pass exposure, the lists of shots may vary among exposure passes, but the union of the shots in any exposure pass covers the same area. Multi-pass writing can reduce over-heating of the resist coating the surface. Multi-pass writing also averages out random errors of the charged particle beam writer. Multi-pass writing using different shot lists for different exposure passes can also reduce the effects of certain systemic errors in the writing process.

Some integrated circuits have physical architectures which include a series of parallel diagonal patterns. The width of these patterns, and the width of the space between adjacent patterns, called the line-space pitch, may be an important element in determining the size and/or performance of the final integrated circuit. For other integrated circuits, where a set of multiple reticles is used to form a single layer of the integrated circuit, one or more reticles in the set may include a series of parallel diagonal patterns, even if the complete pattern exposed on the substrate or wafer using the set of multiple reticles does not contain parallel diagonal patterns. Whether the diagonal patterns exist on both a reticle and the substrate, or just on one or more reticles but not on the substrate, these diagonal patterns are conventionally formed on reticles with series of same-sized constant-pitch non-overlapping VSB shots.

SUMMARY OF THE DISCLOSURE

A method and system for fracturing or mask data preparation or proximity effect correction is disclosed in which a series of charged particle beam shots is determined, where the series of shots is capable of forming a continuous non-manhattan track on a surface, such that the non-manhattan track has a line width roughness (LWR) which nearly equals a target LWR. A method and system for fracturing or mask data preparation or proximity effect correction is also disclosed in which at least two series of shots are determined, where each series of shots is capable of forming a continuous non-manhattan track on a surface, and where the space between tracks has space width roughness (SWR) which nearly equals a target SWR.

DETAILED DESCRIPTION OF THE EMBODIMENTS

The improvements and advantages of the present disclosure can be accomplished by forming continuous track-type patterns generating and using charged particle beam shots, including variable shaped beam (VSB) and circular character projection (CP) shots, and by using simulation-based techniques to determine shot placement, so as to control line width roughness (LWR) and space width roughness (SWR).

Figure 1:
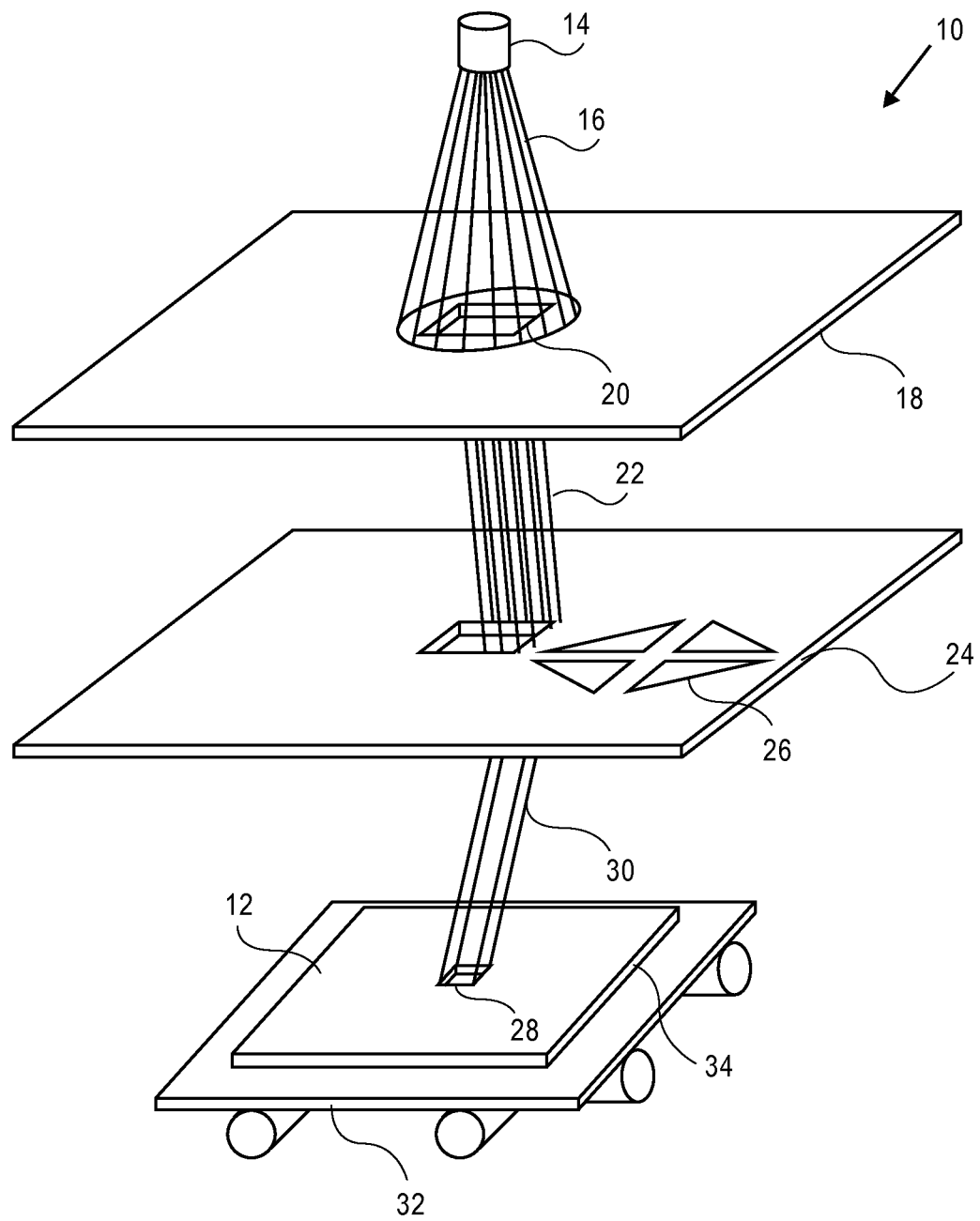
FIG. 1 illustrates an example of a character projection charged particle beam system.

Referring now to the drawings, wherein like numbers refer to like items, FIG. 1 illustrates an embodiment of a lithography system, such as a charged particle beam writer system, in this case an electron beam writer system 10, that employs a variable shaped beam (VSB) to manufacture a surface 12. The electron beam writer system 10 has an electron beam source 14 that projects an electron beam 16 toward an aperture plate 18. The plate 18 has an aperture 20 formed therein which allows the electron beam 16 to pass. Once the electron beam 16 passes through the aperture 20 it is directed or deflected by a system of lenses (not shown) as electron beam 22 toward another rectangular aperture plate or stencil mask 24. The stencil 24 has formed therein a number of openings or apertures 26 that define various simple shapes such as rectangles and triangles. Each aperture 26 formed in the stencil 24 may be used to form a pattern in the surface 12 of a substrate 34, such as a silicon wafer, a reticle or other substrate. An electron beam 30 emerges from one of the apertures 26 and is directed onto the surface 12 as a pattern 28. The surface 12 is coated with resist (not shown) which reacts with the electron beam 30. The electron beam 22 may be directed to overlap a variable portion of an aperture 26, affecting the size and shape of the pattern 28. The surface 12 is mounted on a movable platform 32. The platform 32 allows surface 12 to be repositioned so that patterns which are larger than the maximum deflection capability or field size of the charged particle beam 30 may be written to surface 12. In one embodiment the surface 12 may be a reticle. In this embodiment, the reticle, after being exposed with the pattern, undergoes various manufacturing steps through which it becomes a lithographic mask or photomask. The mask may then be used in an optical lithography machine to project an image of the reticle pattern 28, generally reduced in size, onto a silicon wafer to produce an integrated circuit. More generally, the mask is used in another device or machine to transfer the pattern 28 on to a substrate.

The minimum size pattern that can be projected with reasonable accuracy onto a surface 12 is limited by a variety of short-range physical effects associated with the electron beam writer system 10 and with the surface 12, which normally comprises a resist coating on the substrate 32. These effects include forward scattering, Coulomb effect, and resist diffusion. Beam blur, also called $\beta_f$, is a term used to include all of these short-range effects. The most modern electron beam writer systems can achieve an effective beam blur radius or $\beta_f$ in the range of 20 nm to 30 nm. Forward scattering may constitute one quarter to one half of the total beam blur. Modern electron beam writer systems contain numerous mechanisms to reduce each of the constituent pieces of beam blur to a minimum. Since some components of beam blur are a function of the calibration level of a particle beam writer, the $\beta_f$ of two particle beam writers of the same design may differ. The diffusion characteristics of resists may also vary. Variation of $\beta_f$ based on shot size or shot dose can be simulated and systemically accounted for. But there are other effects that cannot or are not accounted for, and they appear as random variation.

The shot dosage of a charged particle beam writer such as an electron beam writer system is a function of the intensity of the beam source 14 and the exposure time for each shot. Typically the beam intensity remains fixed, and the exposure time is varied to obtain variable shot dosages. The exposure time may be varied to compensate for various long-range effects such as back scatter and fogging in a process called proximity effect correction (PEC). Electron beam writer systems usually allow setting an overall dosage, called a base dosage, which affects all shots in an exposure pass. Some electron beam writer systems perform dosage compensation calculations within the electron beam writer system itself, and do not allow the dosage of each shot to be assigned individually as part of the input shot list, the input shots therefore having unassigned shot dosages. In such electron beam writer systems all shots have the base dosage, before PEC. Other electron beam writer systems do allow dosage assignment on a shot-by-shot basis. In electron beam writer systems that allow shot-by-shot dosage assignment, the number of available dosage levels may be 64 to 4096 or more, or there may be a relatively few available dosage levels, such as 3 to 8 levels. Some embodiments of the current invention are targeted for use with charged particle beam writing systems which allow assignment of one of a relatively few dosage levels.

Conventionally, shots are designed so as to completely cover an input pattern with rectangular shots, while avoiding shot overlap wherever possible. Also, all shots are designed to have a normal dosage, which is a dosage at which a relatively large rectangular shot, in the absence of long-range effects, will produce a pattern on the surface which is the same size as is the shot size. Some electron beam writer systems enforce this methodology by not allowing shots to overlap within an exposure pass.

Figure 2:
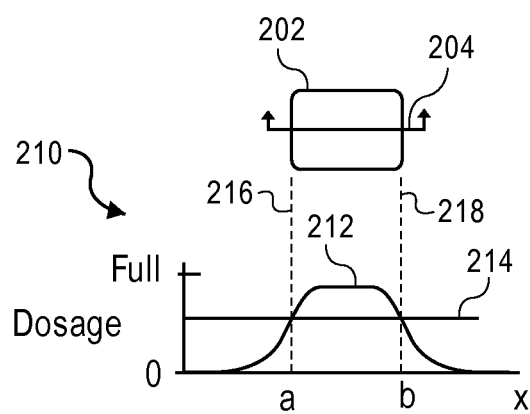
FIG. 2 illustrates a cross-sectional dosage graph of a rectangular VSB shot.

FIG. 2 illustrates an example of a pattern 202 which would be formed on a resist-coated surface by a rectangular VSB shot. Pattern 202 is called a shot outline, which is the pattern that can be formed by the dosage from a single shot. Throughout this disclosure, a pattern which is a shot outline may be referred to as a shot, meaning the shot which can form the shot outline. Dosage graph 210 illustrates the dosage 212 registered along a line 204 through pattern 202, this dosage being called the cross-sectional dosage. As can be seen from dosage curve 212, a pre-determined "full" dosage is registered only in the middle part of pattern 202. On the left and right sides of shot 202, dosage registered by the resist trails off in a Gaussian or nearly-Gaussian curve. Also shown in dosage graph 210 is the resist threshold 214. The resist will register as a pattern on the surface only those areas which receive dosages above the resist threshold 214. The dosage curve 212 intersects the threshold 214 at X-coordinates "a" and "b". The X-coordinate "a" is therefore the minimum X-coordinate that will be registered by the resist along line 204, as shown by connector 216. Similarly, the X-coordinate "b" is the maximum X-coordinate that will be registered by the resist along line 204, as shown by connector 218.

Figure 3A:
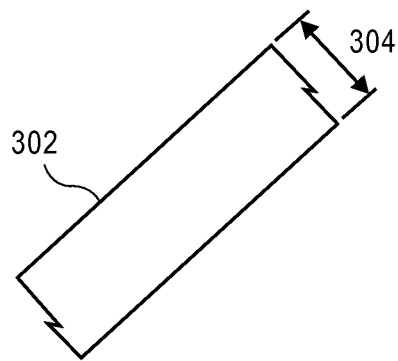
FIG. 3A illustrates an example of a desired fixed-width diagonal pattern to be formed on a substrate.
Figure 3B:
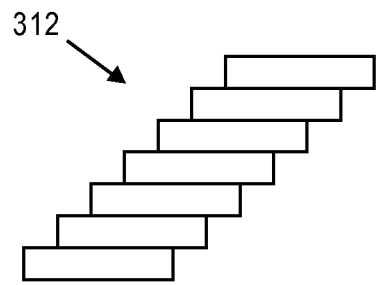
FIG. 3B illustrates an example of a set of conventionally-determined VSB shots for a reticle that can form the pattern of FIG. 3A.
Figure 3C:
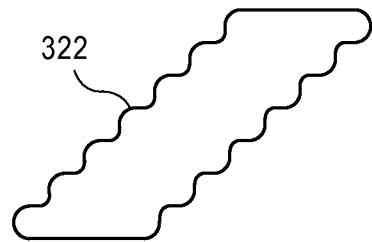
FIG. 3C illustrates an example of a pattern that may be produced on a reticle using the set of VSB shots of FIG. 3B.
Figure 3D:
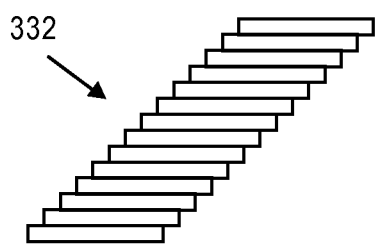
FIG. 3D illustrates another example of a set of conventionally-determined VSB shots for a reticle that can form the pattern of FIG. 3A.
Figure 3E:
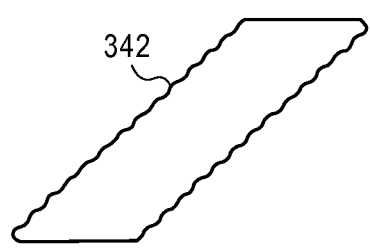
FIG. 3E illustrates an example of a pattern that may be produced on a reticle using the set of VSB shots of FIG. 3D.

FIG. 3A illustrates an example of a diagonal pattern 302, that is to be formed on a substrate such as a silicon wafer, using an optical lithographic process. The optical lithographic process will use a photomask manufactured from a reticle upon which a pattern has been written using a VSB charged particle beam writer. Pattern 302 has a constant width 304. FIG. 3B illustrates an example of a set of conventional non-overlapping VSB shots 312 that may be used to create a reticle to form the pattern 302 on the substrate. All seven shots in the set of shots 312 are the same size in this example, but shots may also be of varying sizes. FIG. 3C illustrates an example of a pattern 322 that may be formed on a reticle from the set of shots 312, with a given beam blur or $\beta_f$. As can be seen, the edges of the pattern 322 are wavy. The waviness is the result of the combination of the beam blur and the size of the shots in the y-direction. The waviness may, in general, be reduced by increasing the beam blur or by reducing the size of the shots in the y-direction. As stated earlier, manufacturers of charged particle beam writers try to minimize the various components of beam blur. FIG. 3D illustrates another example of a set of conventional non-overlapping VSB shots 332 that may be used to create a reticle to form the pattern 302 on the substrate. Each shot in the set of shots 332 is one-half as large in the y-direction as each shot in the set of shots 312. FIG. 3E illustrates an example of a pattern 342 that may be formed on a reticle from the set of shots 332, using the same beam blur as the pattern 322. As can be seen, the magnitude of the waviness in pattern 342 is less than the magnitude of the waviness in pattern 322. However, the 14 shots required to form the pattern 342 may double the writing time, compared to pattern 322.

Figure 4A:
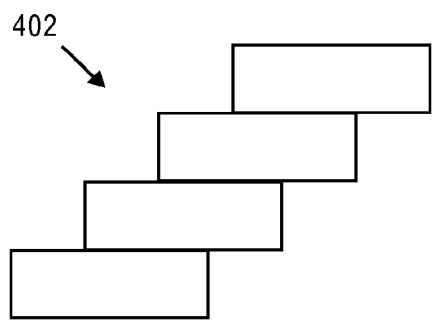
FIG. 4A illustrates another example of a set of conventionally-determined VSB shots for a reticle that can form the pattern of FIG. 3A.
Figure 4B:
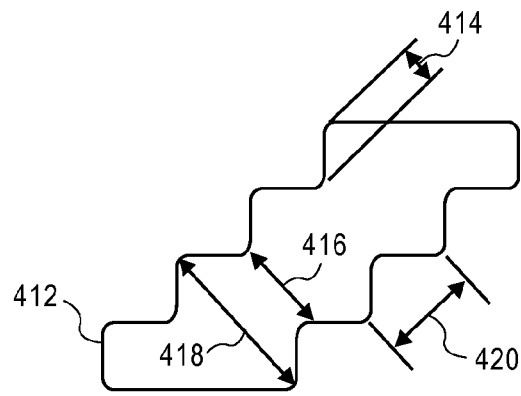
FIG. 4B illustrates an example of a pattern that may be produced on a reticle using the set of VSB shots of FIG. 4A.

FIG. 4A illustrates yet another example of a set of conventional non-overlapping VSB shots 402 that may be used to create a reticle to form the pattern 302 on the substrate. Each shot in the set of shots 402 is twice as large in the y-direction as each shot in set of shots 312. FIG. 4B illustrates a pattern 412 that may be formed on a reticle from the set of shots 402, using the same beam blur as for the pattern 322. As can be seen, the waviness of pattern 412 is larger than that in pattern 322. The magnitude (depth) of the waviness 414 is called line edge roughness (LER). The waviness 414 is periodic, with a period of distance 420, the distance 420 being measured in FIG. 4A between the peaks of adjacent waves. As can be seen the width of pattern 412, measured in a perpendicular direction to the overall direction of the diagonal line 302, varies. The narrowest width is marked 416. The widest width is marked 418. The difference between width 416 and width 418 is the line width roughness (LWR). When patterns such as diagonal pattern 302 are formed using conventional non-overlapping VSB shots, if the beam blur is held constant, both LER and LWR can be changed only by changing the shot size, and therefore the shot density, and therefore the writing time required for the reticle. Furthermore, a constant LWR cannot be achieved with conventional non-overlapping VSB shots.

Figure 5A:
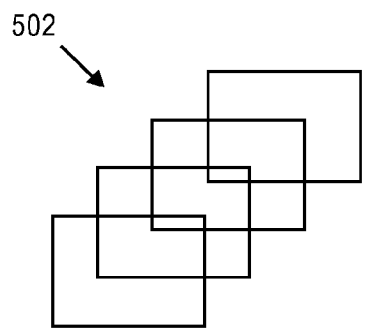
FIG. 5A illustrates an exemplary set of overlapping VSB shots for a reticle that can form the pattern of FIG. 3A.
Figure 5B:
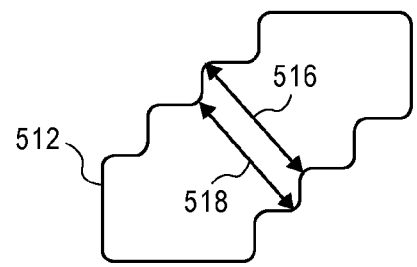
FIG. 5B illustrates an example of a pattern that may be produced on a reticle using the set of overlapping VSB shots of FIG. 5A.

FIG. 5A illustrates an exemplary set of shots 502 which can form a diagonal pattern according to the current invention. The series of four shots in set of shots 502 overlap each other. In particular, each shot except the two end shots overlap one adjacent shot above and one adjacent shot below. As with set of shots 312, the shot spacing in set of shots 502 is constant. FIG. 5B illustrates a pattern 512 that may be formed on a reticle from the set of shots 502, using the same beam blur as for pattern 322. Pattern 512 has a constant width, exclusive of line edge roughness (LER). Although pattern 512 is wavy, the phase of the waviness in the upper and lower sides of the pattern is similar. Consequently, pattern width 516 and pattern width 518 are approximately equal. The LWR of pattern 512 is therefore nearly zero. The smaller LWR may produce improved electrical characteristics for a circuit manufactured with patterns such as pattern 512, compared to patterns such as pattern 412. Since set of shots 402 and set of shots 502 have four shots each, the writing times will be similar. Thus the improvement in LWR by the use of overlapping shots in set of shots 502 has little or no cost in writing time for the reticle. Similarly, a large variation of LWR choices are available for forming a given pattern such as pattern 302. The best LWR may not be to minimize or nearly-minimize it. But whatever is optimal for wafer or circuit performance is selectable without changing the required shot count.

Figure 5C:
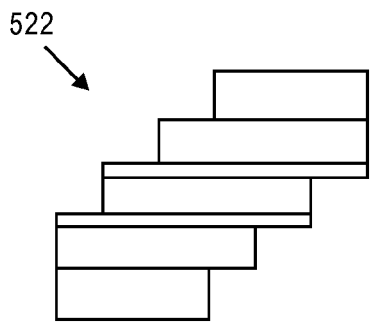
FIG. 5C illustrates an exemplary set of non-overlapping VSB shots for a reticle that may also produce a pattern such as the pattern of FIG. 5B.

FIG. 5C illustrates another exemplary set of shots 522 that may be used to form the pattern 512 on a reticle. As can be seen, the shots in set of shots 522 do not overlap. Unlike conventional set of non-overlapping shots 312, the shots in set of shots 522 are not all the same shape, nor are they equally offset in either the x-dimension or y-dimension, as are the shots in set of shots 312. In one embodiment, the union of set of shots 522 encloses the same area as the union of set of shots 502. For charged particle beam machines that allow shot overlap, set of shots 502 is preferred over set of shots 522 because the write time for set of shots 502 will be less than for set of shots 522. However, for charged particle beam machines that do not allow shot overlap within an exposure pass, set of shots 522 can produce an LWR of nearly zero. In general, a target LWR may be achieved through the use of non-overlapping shots, but the shot count will be approximately twice the shot count achievable with overlapping shots.

The diagonal pattern of FIG. 3A is an example of a continuous track. The techniques of the current invention illustrated in FIGS. 5A-C may be used to generate VSB shots to form curvilinear tracks as well as straight diagonal or non-manhattan tracks. In some embodiments, a track may have a non-constant width. The minimum LWR attainable for some types of tracks may be larger than zero.

Use of overlapping shots complicates the calculation of the pattern that will be produced on a resist-coated reticle. Charged particle beam simulation may be used to calculate the reticle pattern. Charged particle beam simulation may involve simulation of various effects, including forward scattering, backward scattering, resist diffusion, Coulomb effect, etching, fogging, loading and resist charging.

When overlapping VSB shots are used, LWR may be varied by adjusting overlap between adjacent shots. Such adjustment may allow formation of a track with an LWR which nearly equals a target LWR. In practice, a tolerance of 0.1 nm to 4 nm may be considered nearly equal. The most suitable LWR may be pre-determined, or may be determined through optical lithography simulation of the pattern that will be produced on a substrate such as a wafer using a photomask generated from a reticle. A change of shot overlap will change both LER and LWR. Change of shot dimensions, in both the x-direction and the y-direction, as well as shot overlap may be used to achieve a desired LER and LWR combination, while producing a minimum or near-minimum shot count. In this disclosure, near-minimum and minimum are used interchangeably, since calculating a true-minimum shot count may not be computationally expedient.

Figure 6A:
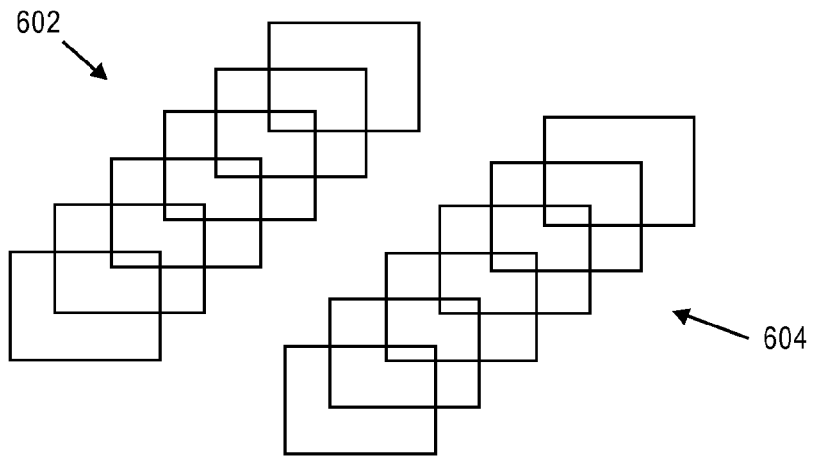
FIG. 6A illustrates an example of two adjacent sets of overlapping VSB shots.
Figure 6B:
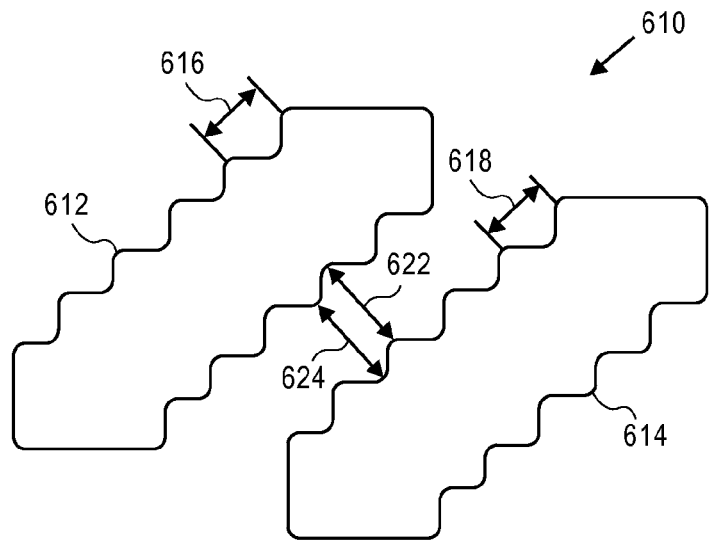
FIG. 6B illustrates an example of two adjacent track patterns that may be produced on a reticle using the sets of shots of FIG. 6A.

When two tracks are designed to be adjacent to each other—that is, separated by a space but with no other tracks between them—a minimum spacing must be maintained. This waviness is called space width roughness, or SWR. FIG. 6A illustrates two sets of overlapping VSB shots 602 and 604 designed according to another embodiment of the current invention. FIG. 6B illustrates an example of a pair of tracks 610 that may be formed on a reticle from sets of shots 602 and 604. The pair of tracks 610 comprises track 612 and track 614, where track 612 and track 614 are adjacent to each other. In this example of parallel wavy lines which have straight center lines, the period 616 of track 612 equals the period 618 of track 614. According to another embodiment of the current invention, VSB shots may be generated for two adjacent tracks so that the waviness of the two tracks is in phase or nearly in phase. For tracks with straight center lines, such as those used to form straight patterns such as pattern 302, the waviness of adjacent tracks that are in phase will have equal periods. For curvilinear tracks, the waviness of adjacent tracks will be different. In FIG. 6B, this is illustrated with width 622 and width 624. Width 622 and width 624 are measured one-half of a period apart, at locations where pattern 612 is closest to pattern 614 and also where pattern 612 is furthest from pattern 614. The difference between widths 622 and width 624 is the SWR. In FIG. 6B, since width 622 and width 624 are approximately equal, the SWR is nearly zero. In the case where SWR is to be minimized, and where the adjacent tracks are straight, so that shots have equal periods, SWR minimization can be achieved by relatively aligning the tracks so that the corresponding portions of the waves from each track's facing edge are aligned along a line perpendicular to the direction of the track. The measurements 622 and 624, which are made in this perpendicular direction, illustrate this configuration. Whether minimizing the SWR is best for wafer results or for electrical characteristics, the most suitable SWR for a design may be pre-determined, or may be determined through lithography simulation of the pattern produced on a wafer by the mask pattern such as pair of tracks 610. In practice, a target SWR may be achievable within a 0.1 nm to 4.0 nm tolerance. Unlike LWR, SWR may be controlled according to the present disclosure using non-overlapping shots without a large shot count penalty. In other embodiments, use of overlapping shots allows control of both LWR and SWR without the large shot count penalty.

Figure 6C:
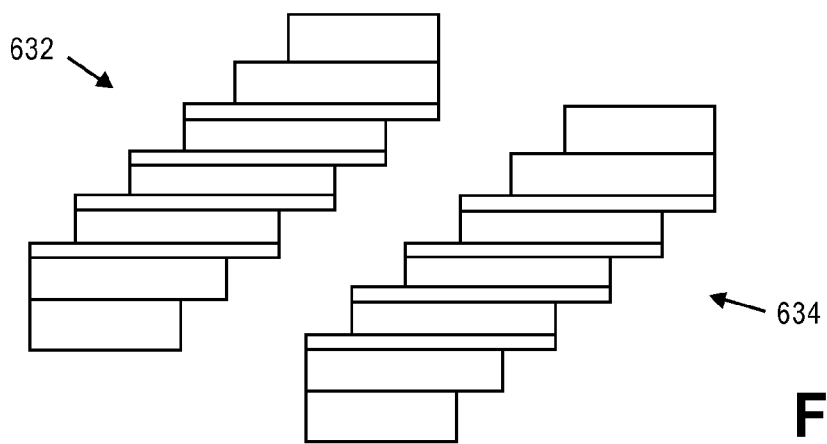
FIG. 6C illustrates an example of two adjacent sets of non-overlapping VSB shots that may produce a pattern such as the pattern of FIG. 6B.

FIG. 6C illustrates an example of two sets of non-overlapping VSB shots 632 and 634 which may also form the patterns 612 and 614. Each set of shots 632 and 634 consists of eleven shots, compared to the six shots of sets of shots 602 and 604. In one embodiment, the union of set of shots 632 encloses the same area as the union of set of shots 602. Similarly, the union of set of shots 634 encloses the same area as the union of set of shots 604. Sets of shots 632 and 634 may be used to form pattern such as pair of tracks 610 which have a pre-determined SWR, such as a nearly-zero SWR, and a pre-determined LWR. Non-overlapping shots such as sets of shots 632 and 634 are useful when shots are generated for an electron beam writer system that does not allow overlapping shots within an exposure pass.

Some embodiments of the current invention may use complex character projection (CP) characters to form tracks. In particular, circular CP characters can be used. Charged particle beam simulation may be used to calculate LWR and SWR, using the same techniques set forth in the above examples.

The calculations described or referred to in this invention may be accomplished in various ways. Generally, calculations may be accomplished by in-process, pre-process or post-process methods. In-process calculation involves performing a calculation at the time when its results are needed. Pre-process calculation involves pre-calculating and then storing results for later retrieval during a subsequent processing step, and may improve processing performance, particularly for calculations that may be repeated many times. Calculations may also be deferred from a processing step and then done in a later post-processing step. An example of pre-process calculation is pre-calculating a pattern formed by two overlapping shots in the vicinity of the shot overlap. Another example of pre-process calculation is a shot group, which is a pre-calculation of dosage pattern information for one or more shots associated with a given input pattern or set of input pattern characteristics. The shot group and the associated input pattern may be saved in a library of pre-calculated shot groups, so that the set of shots comprising the shot group can be quickly generated for additional instances of the input pattern, without pattern re-calculation. In some embodiments, the pre-calculation may comprise simulation of the dosage pattern that the shot group will produce on a resist-coated surface. In other embodiments, the shot group may be determined without simulation, such as by using correct-by-construction techniques. In some embodiments, the pre-calculated shot groups may be stored in the shot group library in the form of a list of shots. In other embodiments, the pre-calculated shot groups may be stored in the form of computer code that can generate shots for a specific type or types of input patterns. In yet other embodiments, a plurality of pre-calculated shot groups may be stored in the form of a table, where entries in the table correspond to various input patterns or input pattern characteristics such as pattern width, and where each table entry provides either a list of shots in the shot group, or information for how to generate the appropriate set of shots. Additionally, different shot groups may be stored in different forms in the shot group library. In some embodiments, the dosage pattern which a given shot group can produce may also be stored in the shot group library. In one embodiment, the dosage pattern may be stored as a two-dimensional (X and Y) dosage map called a glyph.

Figure 7:
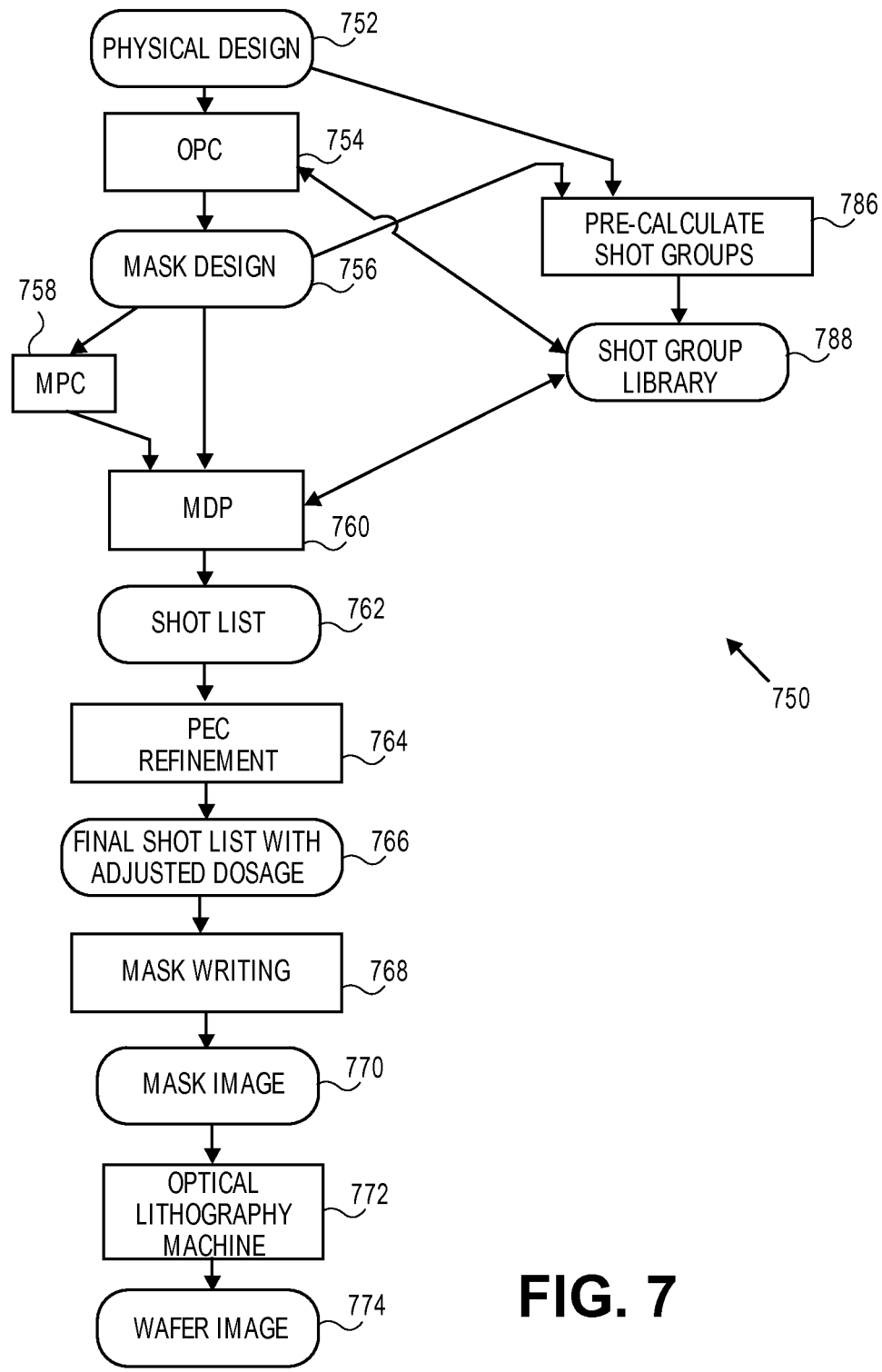
FIG. 7 illustrates a conceptual flow diagram of how to prepare a surface, such as a reticle, for use in fabricating a substrate such as an integrated circuit on a silicon wafer using optical lithography.

FIG. 7 is a conceptual flow diagram 750 of how to prepare a reticle for use in fabricating a surface such as an integrated circuit on a silicon wafer. In a first step 752, a physical design, such as a physical design of an integrated circuit, is designed. This can include determining the logic gates, transistors, metal layers, and other items that are required to be found in a physical design such as that in an integrated circuit. The physical design may be rectilinear, partially curvilinear, or completely curvilinear. Next, in a step 754, optical proximity correction is determined. In an embodiment of this disclosure, this can include taking as input a library of pre-calculated shot groups from a shot group library 774. In an embodiment of this disclosure, an OPC step 754 may also include simultaneous optimization of shot count or write times, and may also include a fracturing operation, a shot placement operation, a dose assignment operation, or may also include a shot sequence optimization operation, or other mask data preparation operations, with some or all of these operations being simultaneous or combined in a single step. The OPC step 754 may create partially or completely curvilinear patterns. The output of the OPC step 754 is a mask design 756.

Mask process correction (MPC) 758 may optionally be performed on the mask design 756. MPC modifies the pattern to be written to the mask so as to compensate for non-linear effects, such as effects associated with patterns smaller than about 100 nm in conventional optical lithographic masks. MPC may also be used to compensate for non-linear effects affecting EUV masks. If MPC 758 is performed, its output becomes the input for mask data preparation (MDP) step 760. In a step 760, a mask data preparation operation which may include a fracturing operation, a shot placement operation, a dose assignment operation, or a shot sequence optimization may take place. MDP may use as input the mask design 756 or the results of MPC 758. In some embodiments of the present invention, MPC may be performed as part of a fracturing or other MDP operation. Other corrections may also be performed as part of fracturing or other MDP operation, the possible corrections including: forward scattering, resist diffusion, Coulomb effect, etching, backward scattering, fogging, loading, resist charging, and EUV midrange scattering. The result of MDP step 760 is a shot list 762, either for one or for multiple exposure passes in mask writing step 768. Either the OPC step 754 or the MDP step 760, or a separate program 786 can include pre-calculating one or more shot groups that may be used for a given input pattern, and storing this information in a shot group library 788. Combining OPC and any or all of the various operations of mask data preparation in one step is contemplated in this disclosure. Mask data preparation step 760 may comprise generating VSB shots for patterns in the mask design 756 which are non-manhattan tracks, where the tracks may be diagonal or curvilinear, and of constant or variable width. Mask data preparation step 760 may also comprise a pattern matching operation to match pre-calculated shot groups to create a mask that matches closely to the mask design.

In step 764 proximity effect correction (PEC) refinement may be performed on shot list 762 to create a final shot list 766 with adjusted dosages. The final shot list 766 is used to generate a surface in a mask writing step 768, which uses a charged particle beam writer such as an electron beam writer system. In some embodiments, PEC refinement 764 may be performed by the charged particle beam writer. Mask writing step 768 may use a stencil containing both VSB apertures and a plurality of complex characters, or may use a stencil comprising only VSB apertures. Mask writing step 768 may comprise a single exposure pass or multiple exposure passes. The electron beam writer system projects a beam of electrons through the stencil onto a surface to form a mask image comprising patterns on the surface as shown in a step 770. The completed surface may then be used in an optical lithography machine, which is shown in a step 772. Finally, in a step 774, a substrate such as a silicon wafer is produced. A shot group pre-calculation step 786 provides information to the shot group library 788. Also, the shot group pre-calculation step 786 may use as input the physical design 752 or the mask design 756, and may pre-calculate one or more shot groups, which are stored in a shot group library 788.

The fracturing, mask data preparation, proximity effect correction and shot group creation flows described in this disclosure may be implemented using general-purpose computers with appropriate computer software as computation devices. Due to the large amount of calculations required, multiple computers or processor cores may also be used in parallel. In one embodiment, the computations may be subdivided into a plurality of 2-dimensional geometric regions for one or more computation-intensive steps in the flow, to support parallel processing. In another embodiment, a special-purpose hardware device, either used singly or in multiples, may be used to perform the computations of one or more steps with greater speed than using general-purpose computers or processor cores. In one embodiment, the special-purpose hardware device may be a graphics processing unit (GPU). In another embodiment, the optimization and simulation processes described in this disclosure may include iterative processes of revising and recalculating possible solutions, so as to minimize either the total number of shots, or the total charged particle beam writing time, or some other parameter. In yet another embodiment, an initial set of shots may be determined in a correct-by-construction method, so that no shot modifications are required.

While the specification has been described in detail with respect to specific embodiments, it will be appreciated that those skilled in the art, upon attaining an understanding of the foregoing, may readily conceive of alterations to, variations of, and equivalents to these embodiments. These and other modifications and variations to the present methods for fracturing, mask data preparation, proximity effect correction and optical proximity correction may be practiced by those of ordinary skill in the art, without departing from the spirit and scope of the present subject matter, which is more particularly set forth in the appended claims. Furthermore, those of ordinary skill in the art will appreciate that the foregoing description is by way of example only, and is not intended to be limiting. Steps can be added to, taken from or modified from the steps in this specification without deviating from the scope of the invention. In general, any flowcharts presented are only intended to indicate one possible sequence of basic operations to achieve a function, and many variations are possible. Thus, it is intended that the present subject matter covers such modifications and variations as come within the scope of the appended claims and their equivalents.

What is claimed is:

1. A method for forming a set of patterns on a surface, the method comprising:
   providing a charged particle beam source;
   determining a target space width roughness (SWR); and
   exposing two series of shots on the surface, each series having two or more charged particle beam shots each, wherein each series of shots forms a continuous non-manhattan track on the surface, wherein the tracks have a space between them, and wherein the space between the tracks comprises an actual SWR, and wherein the actual SWR is within a first pre-determined tolerance of the target SWR.

2. The method of claim 1, wherein each shot in each series of shots overlaps another shot in the same series, and wherein the method further comprises determining a target line width roughness (LWR), wherein the LWR of the track formed by each series of shots is within a second pre-determined tolerance of the target LWR.

3. A system for fracturing or mask data preparation or proximity effect correction for use with shaped beam charged particle beam lithography, the system comprising:
   a target space width roughness (SWR);
   a special-purpose hardware device capable of determining at least two series of at least two shots each, the special-purpose hardware device including a computing hardware processor, wherein each series of shots can form a continuous non-manhattan track on a surface, wherein the tracks have a space between them, and wherein the space between the tracks formed by the two series of shots comprises an actual SWR, and wherein the actual SWR is within a pre-determined tolerance of the target SWR; and
   a device capable of outputting the two series of two or more shots.

4. The system of claim 3 wherein each shot in each series of shots overlaps another shot in the same series.

5. The system of claim 3 wherein the shots are variable shaped beam (VSB) shots.

6. The system of claim 3 wherein the shots are circular character projection (CP) shots.

7. The system of claim 3 wherein the difference between the actual SWR and the target SWR is in the range of 0.1 nm to 4.0 nm.

8. The system of claim 3 wherein the actual SWR is minimized.

9. The system of claim 8 wherein the actual SWR is between 0.1 nm and 4.0 nm.

10. The system of claim 3, further comprising a device capable of determining the target SWR.

11. The system of claim 10 wherein the device capable of determining the target SWR performs lithography simulation.

* * * * *